United States Patent
Huang et al.

(10) Patent No.: US 11,637,214 B2
(45) Date of Patent: *Apr. 25, 2023

(54) TEMPERATURE INSENSITIVE OPTICAL RECEIVER

(71) Applicant: Hewlett Packard Enterprise Development LP, Houston, TX (US)

(72) Inventors: Zhihong Huang, Milpitas, CA (US); Di Liang, Santa Barbara, CA (US); Yuan Yuan, Milpitas, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/664,462

(22) Filed: May 23, 2022

(65) Prior Publication Data
US 2023/0057021 A1    Feb. 23, 2023

Related U.S. Application Data

(62) Division of application No. 16/902,135, filed on Jun. 15, 2020, now Pat. No. 11,342,472.

(51) Int. Cl.
*H01L 21/20* (2006.01)
*H01L 29/861* (2006.01)
(Continued)

(52) U.S. Cl.
CPC ........ *H01L 31/105* (2013.01); *H01L 27/1446* (2013.01); *H01L 31/028* (2013.01);
(Continued)

(58) Field of Classification Search
CPC ............ H01L 31/02366; H01L 31/028; H01L 29/6609; H01L 29/66204; H01L 27/14643–14652
(Continued)

(56) References Cited

U.S. PATENT DOCUMENTS 7,209,623 B2 * 4/2007 Morse ................. G02B 6/4215
257/458
7,326,905 B2    2/2008 Kuhara et al.
(Continued)

FOREIGN PATENT DOCUMENTS

CN    1858916 A    11/2006
CN    1914741 A    2/2007
(Continued)

OTHER PUBLICATIONS

Campbell et al., "Recent Advances in Avalanche Photodiodes", Journal of Lightwave Technology, vol. 34, No. 2, Jan. 15, 2016, pp. 278-285.
(Continued)

*Primary Examiner* — Calvin Lee
(74) *Attorney, Agent, or Firm* — Hewlett Packard Enterprise Patent Department

(57) ABSTRACT

A device may include: a highly doped $n^+$ Si region; an intrinsic silicon multiplication region disposed on at least a portion of the $n^+$ Si region, the intrinsic silicon multiplication region having a thickness of about 90-110 nm; a highly doped $p^-$ Si charge region disposed on at least part of the intrinsic silicon multiplication region, the $p^-$ Si charge region having a thickness of about 40-60 nm; and a $p^+$ Ge absorption region disposed on at least a portion of the $p^-$ Si charge region; wherein the $p^+$ Ge absorption region is doped across its entire thickness. The thickness of the $n^+$ Si region may be about 100 nm and the thickness of the $p^-$ Si charge region may be about 50 nm. The $p^+$ Ge absorption region may confine the electric field to the multiplication region and the charge region to achieve a temperature stability of 4.2 mV/°C.

16 Claims, 7 Drawing Sheets

(51) Int. Cl.
*H01L 31/105* (2006.01)
*H01L 31/028* (2006.01)
*H04B 10/66* (2013.01)
*H01L 27/144* (2006.01)
*H01L 31/18* (2006.01)
*H04J 14/02* (2006.01)

(52) U.S. Cl.
CPC ......... *H01L 31/1804* (2013.01); *H04B 10/66* (2013.01); *H04J 14/02* (2013.01)

(58) Field of Classification Search
USPC ................. 257/603, 613–616, 745; 438/603, 438/613–616, 745
See application file for complete search history.

(56) References Cited

U.S. PATENT DOCUMENTS

| | | | |
|---|---|---|---|
| 7,557,387 | B2 | 7/2009 | Ishibashi et al. |
| 7,651,880 | B2 | 1/2010 | Tweet et al. |
| 9,496,435 | B2 | 11/2016 | Wang et al. |
| 11,043,523 | B1 | 6/2021 | Or-Bach et al. |
| 11,342,472 | B2* | 5/2022 | Huang ................. H01L 27/1446 |
| 2002/0195616 | A1 | 12/2002 | Bond |
| 2007/0200141 | A1 | 8/2007 | Ishibashi et al. |
| 2008/0121805 | A1 | 5/2008 | Tweet et al. |
| 2015/0001581 | A1 | 1/2015 | Oda et al. |

FOREIGN PATENT DOCUMENTS

| | | |
|---|---|---|
| CN | 100495741 C | 6/2009 |
| CN | 100527449 C | 8/2009 |

OTHER PUBLICATIONS

Huang et al., "25 Gbps low-voltage waveguide Si—Ge avalanche photodiode", Optica, vol. 3, No. 8, Aug. 2016, pp. 793-798.
Liu et al., "Low-cost hybrid integrated 4×25 GBaud PAM-4 CWDM ROSA with a PLC-based arrayed waveguide grating demultiplexer", Photonics Research, vol. 7, No. 7, Jul. 2019, 6 pages.

* cited by examiner

| SACM APD Types | Multiplication Width (μm) | Depletion Width (μm) | $\Delta V_{bd}/\Delta T$ (mV/°C) |
| --- | --- | --- | --- |
| InAlAs-InGaAs | 0.13 | 0.75 | 15 |
| | 0.15 | 1.15 | 23 |
| | 0.2 | 1.1 | 21 |
| | 0.2 | 1.4 | 25 |
| | 1 | 2.7 | 40 |
| InP-InGaAs | 0.2 | 1.2 | 46 |
| | 0.4 | 3.27 | 150 |
| | 0.5 | 3.5 | 150 |
| | 0.8 | 2.4 | 100 |
| Si-Ge | 0.1 | 0.15 | 4.2 |

TEMPERATURE INSENSITIVE OPTICAL RECEIVER

This application is a continuation of U.S. Patent application Ser. No. 16/902,135 filed on Jun. 15, 2020, now U.S. Pat. No. 11,342,472 issued May 24, 2022, the disclosure of which is expressly incorporated by reference herein in its entirety.

STATEMENT OF GOVERNMENT RIGHTS

This invention was made with Government support under Agreement Number H98230-19-3-0002. The Government has certain rights in the invention.

DESCRIPTION OF RELATED ART

Data transmission has grown and continues to grow explosively due to the massive growth of data-based applications such as Internet of Things (IoT), machine learning and cloud computing. The massive growth in data communication requires that data centers and high-performance computers (HPCs) ultimately adopt high-bandwidth-density optical interconnects, integrated silicon photonics with on-chip lasers and SiGe avalanche photodiodes (APDs) is a competitive solution due to its large scale integrability, low cost, and low energy consumption.

Currently data centers and HPCs consume $4{:}16 \times 10^{11}$ W of power, and this number is growing exponentially. A large percentage of the total consumed energy is for cooling in data centers. Meanwhile, a one-degree-increase in the operating tolerance of a data center can save approximately 4% of the energy consumed to cool the space.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

The figures are not exhaustive and do not limit the present disclosure to the precise form disclosed.

DETAILED DESCRIPTION

A photodiode may convert optical signals into electrical signals by absorbing optical energy (e.g., photons) and moving electrons to a conduction band in response to absorbing the optical energy. The electrons in the conduction band are free electrons able to travel through the photodiode in response to an electric field. The photodiode, which may be implemented as an avalanche photodiode (APD) may internally amplify the electrical signal by accelerating the electrons until they free additional electrons through impact ionization. The amplified electrical signal may be output by the APD.

An APD is a type of semiconductor photodiode device in which light energy is converted into electrical energy due to the photoelectric effect coupled with electric current multiplication as a result of avalanche mechanism. With APDs, incoming photons trigger a charge avalanche due to the application of a high reverse bias voltage across the device.

Various embodiments may include a fully doped $p^+$ Ge absorption region with a width of about 400 nanometers (nm), a charge region width of about 50 nm, and a multiplication region width of about 100 nm. Such an embodiment may achieve: a high multiplication gain of >15, from 23° C. to 90° C.; temperature stability of $\Delta V_{bd}/\Delta T = 4.2$ mV/° C., which the inventors believe has not been achieved in telecommunication wavelength APDs; a high bandwidth of about 24.6 GHz at 90 ° C., and only reduced by about 0.09%/° C.; a high gain-bandwidth product of >240 GHz at 90 ° C., which reduces by about 0.24%/° C.; and an internal quantum efficiency of about 100% when temperatures are greater than 70° C.

Figure 1:
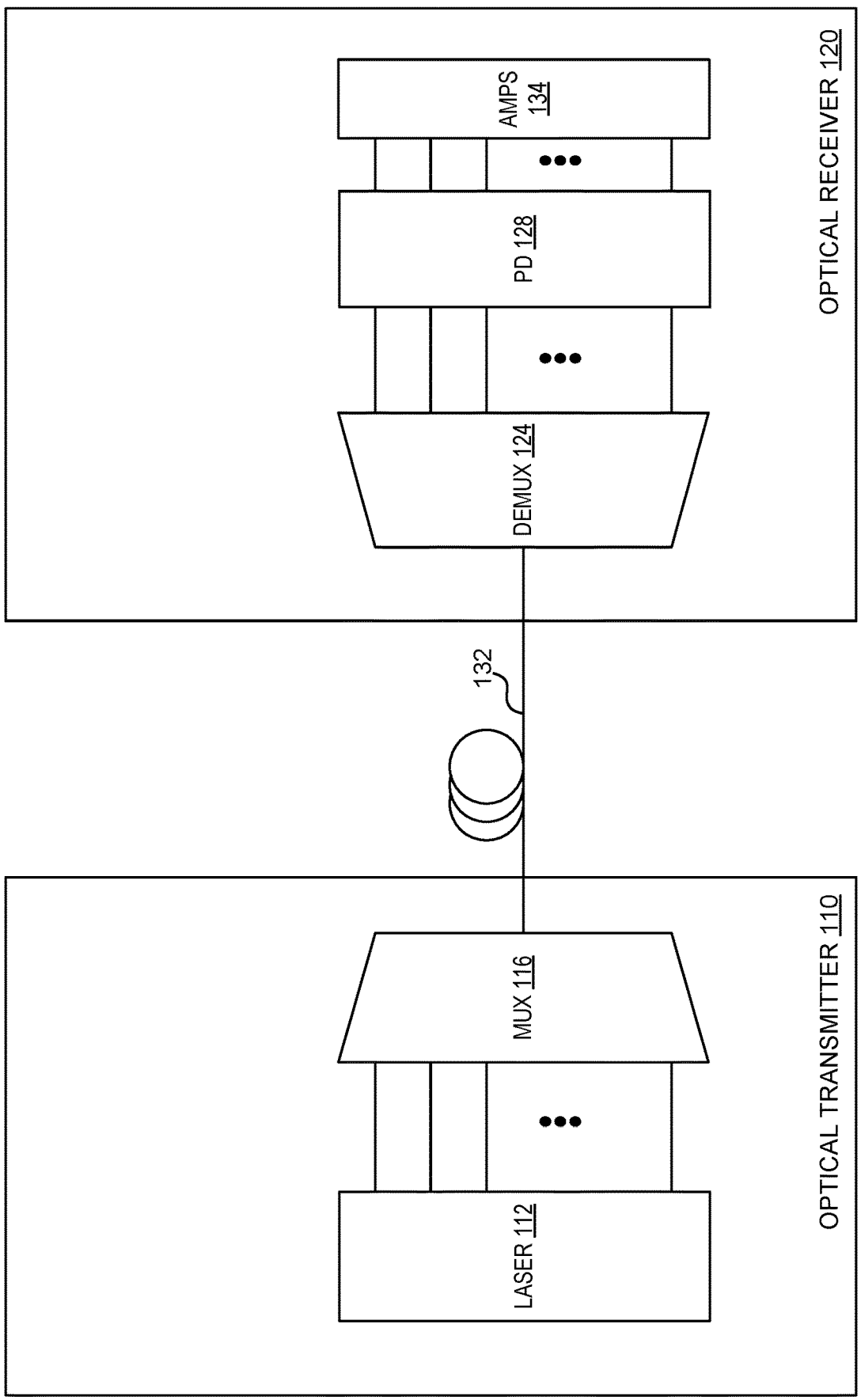
FIG. 1 is a diagram illustrating an example optical communication system with which embodiments may be implemented.

Before describing example embodiments in detail, it is useful to discuss one example application with which these and other embodiments may be implemented. FIG. 1 is a diagram illustrating an example optical communication system with which embodiments may be implemented. Referring now to FIG. 1, the example system includes an optical transmitter 110, an optical receiver 120 and an optical fiber communication link 130. This example optical transmitter 110 includes a transmit laser 112 to transmit data using an optical signal. In some embodiments, laser direct modulation can be used in which an IC driver can be provided to apply a modulated electrical signal to the laser to convert the electrical signal into an optical signal. In other embodiments, a continuous wave (CW) laser can be used and an optical modulator provided at the output of the laser to modulate the optical signal with the data.

The output of optical transmitter 110 is coupled to optical fiber 132 of the optical fiber communication link 130 via an optical coupler (not shown). At the receiving end, optical receiver 120 includes an optical coupler (not shown) to couple light from optical fiber 132 into a waveguide of optical receiver 120. Although the described example uses a waveguide receiver, the receiver may also be implemented using discrete components. A photodetector 128 (e.g., one or more photodiodes) may be included to detect the optical signal and convert it into an electrical signal for processing or storage. The current output from the photodiodes can be provided to their corresponding amplifiers 134, which may be implemented, for example, as transimpedance amplifiers. Although not illustrated, optical receiver 120 may also include for each channel a variable gain amplifier, equalization circuits (continuous time linear equalization and/or decision feedback equalization), a slicer (comparator), and so on. A more complex receiver may also include an analog to digital converter and a processor, such as a digital signal processor.

The example optical communication system may be implemented as a wavelength division multiplex (WDM)

system capable of multiplexing and transmitting multiple channels of information across a single signal path (e.g., a single fiber 130).

Accordingly, the communication system may include multiple lasers 112 and multiple photodetectors 128. Each laser 112 in the WDM system may be configured to produce a light signal at a designated wavelength, each of which may be referred to as a channel in the WDM system. The lasers 112 may include any of a number of different types of lasers including, for example, Vertical-Cavity Surface-Emitting Lasers (VCSELs), Distributed Bragg Reflex Lasers (DBRs), Distributed Feedback Lasers (DFBs), and other semiconductor lasers. In some embodiments, a comb laser may be used to provide a frequency comb, each wavelength of which may be modulated, for example, using an optical modulator for each frequency line. The WDM system may also include a multiplexer 118 to multiplex the multiple light signals from the lasers into a WDM optical signal. In WDM embodiments, modulation may occur individually for each channel (i.e., for each light source) such that each channel can carry different information. The multiplexed channels can then be launched onto optical fiber 132. At optical receiver 120, the WDM signal may be demultiplexed using a demultiplexer 124 to separate the WDM signal into its individual channels. Each channel may be provided, via a waveguide, to its corresponding or respective photodetector of multiple photodetectors 128.

In various implementations such as a silicon photonics application, the optical signals can be propagated through planar waveguide structures fabricated on a substrate. One example planar waveguide that may be used is a slab waveguide. The optical signals propagate within a planar slab of relatively high index material that is surrounded by a cladding having a lower index of refraction. A core/cladding interface exists at the boundary between the core region and the cladding region such that when light in the core region is incident upon this core/cladding interface at an angle greater than the critical angle, the light is reflected back into the core region. This serves to confine the light within the slab waveguide by total internal reflection, but some optical energy may exist within the cladding region outside the core. This is often referred to as evanescent energy or an evanescent field. The slab waveguide may be configured to carry a plurality of independent optical signals by providing ribs, ridges, strips or like structures extending along a side of the slab. The optical energy propagating within the slab may localized to different regions within the slab as defined by these structures.

Waveguides can be fabricated in a wide variety of geometries and configurations. A channel waveguide, such as a buried channel or embedded strip waveguide may generally include a core of relatively high index material that is surrounded by a cladding having a lower index of refraction. The substrate may form at least part of the surrounding cladding region.

A ridge or rib waveguide may also be used, and may be formed by depositing material on or removing material from (or both) selected regions of the slab, resulting in thickness variations in the slab waveguide. A strip-loaded waveguide may be formed by depositing a strip of material on the slab. The strip may have a refractive index that is greater than that of the cladding layers, but it may be approximately equal to that of the slab. The strip may be included to induce an increase in the effective index of the slab in the region proximate the strip. Although various integrated waveguide examples are provided, as noted above, in some implementations the receiver may be implemented using discrete components.

The couplers may be implemented as grating couplers having a flared waveguide portion with a relatively narrow end portion to engage the waveguide expanding to a wider end portion to couple to the fiber. The flared portion includes elongate scattering elements positioned to couple light between the coupler and an optical fiber or other optical element.

The communication system illustrated in and described above with respect to FIG. 1 is only one example of a communication system with which embodiments may be implemented. Embodiments may be implemented with any of a number of other optical communication systems.

Figure 2:
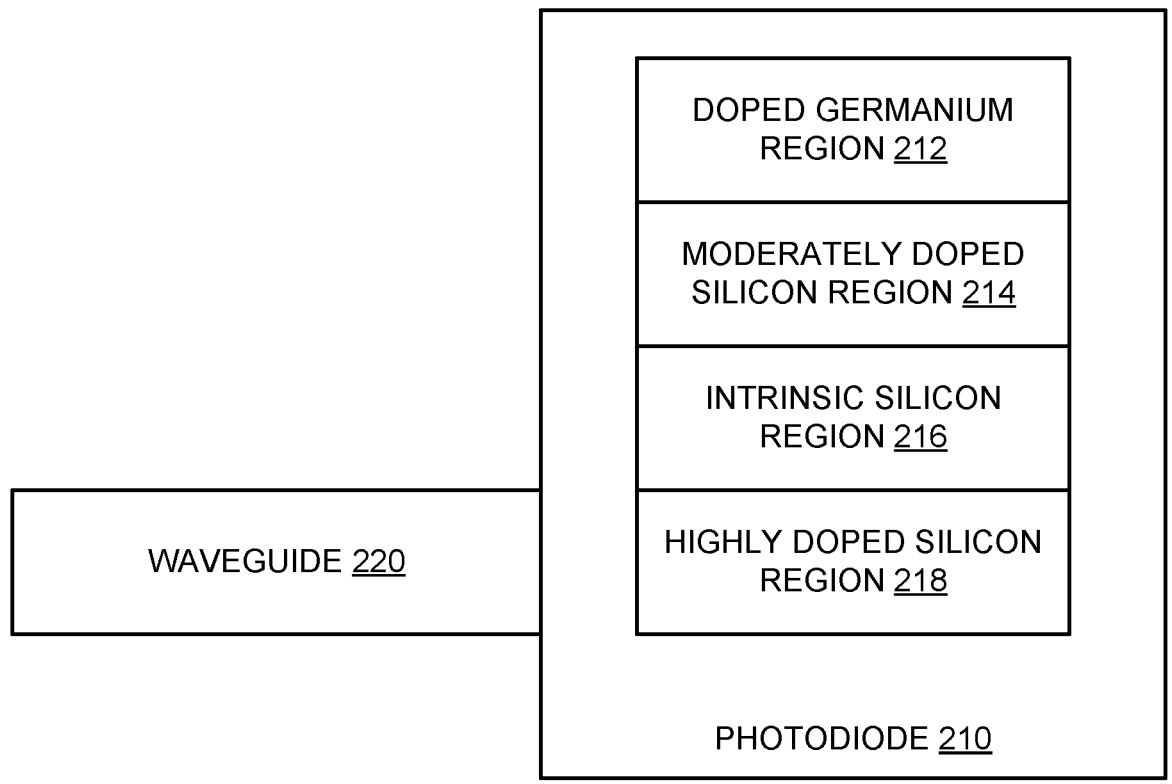
FIG. 2 is a block diagram of an example of a system to detect optical energy in accordance with various embodiments.

FIG. 2 is a block diagram of an example of a system 200 to detect optical energy in accordance with various embodiments. The system 200 may include a photodiode 210 to convert an optical signal into electrical signal and amplify the electrical signal. The system 200 may also include a waveguide 220 electromagnetically coupled to the photodiode 210. The waveguide 220 may receive an optical signal, for example from a grating coupler (not shown) or demultiplexer (e.g. demultiplexer 124), and direct the received optical signal to photodiode 210 so that the photodiode 210 can convert the optical signal into an electrical signal. The photodiode 210 may include a doped germanium region 212. For example, the doped germanium region 212 may be an at least moderately doped germanium region (e.g., a moderately or highly doped germanium region). In one embodiment, doped germanium region 212 may be a p-type region doped to a concentration of about $2 \times 10^{18}$ atoms/cm$^3$.

The photodiode 210 may include a moderately doped silicon region 214 in direct contact with the doped germanium region 212. The photodiode 210 may include an intrinsic silicon region 216 in direct contact with the moderately doped silicon region 214. As used herein, the term "intrinsic" refers to a semiconductor having a concentration of doped atoms of at most about $5 \times 10^{16}$ atoms/cm$^3$. The photodiode 210 may include a highly doped silicon region 218 in direct contact with the intrinsic silicon region 216.

As used herein, the term "region" refers to a portion of the photodiode 210 or other device occupied by a particular material. As used herein, the term "moderately doped" refers to a semiconductor having a concentration of doped atoms between about $5 \times 10^{16}$ atoms/cm$^3$ and about $5 \times 10^{18}$ atoms/cm$^3$. As used herein, the term "highly doped" refers to a semiconductor having a concentration of doped atoms of at least about $2 \times 10^{18}$ atoms/cm$^3$. As used herein, the term "about" a particular value refers to numbers that are equal to the particular value when rounded to the least significant digit of the particular value. As used herein, the term "intrinsic" refers to a semiconductor having a concentration of doped atoms of at most about $5 \times 10^{16}$ atoms/cm$^3$. The term "about" may also refer to numbers that are achievable given the particular fabrication process used to fabricate the device, recognizing that semiconductor fabrication techniques typically do not yield zero-tolerance results.

Figure 3:
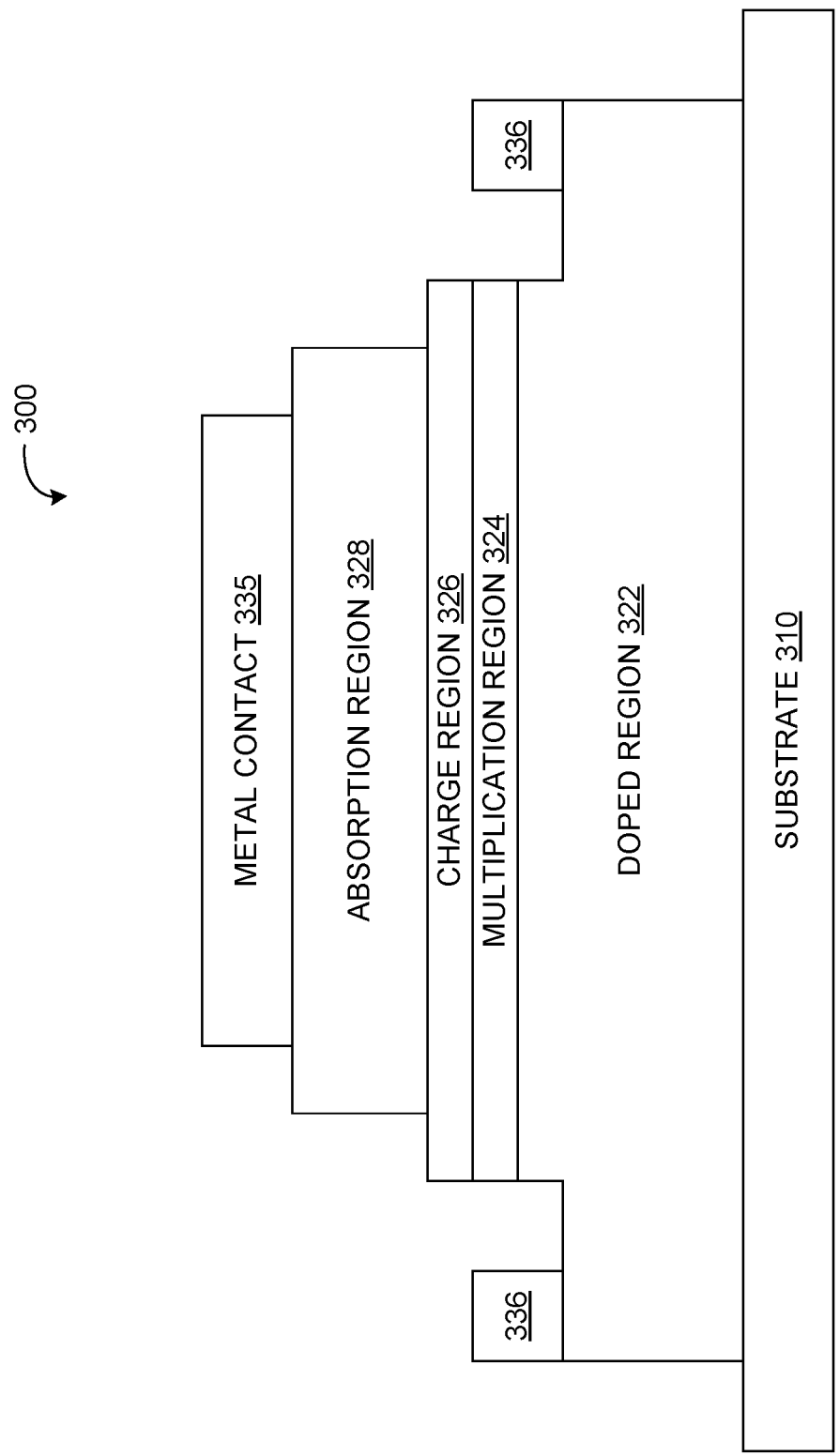
FIG. 3 is a schematic diagram of a cross-section of another example of a system to detect optical energy.

FIG. 3 is a schematic diagram of a cross-section of another example of a system to detect optical energy. The system may include a photodiode 300 (e.g., an avalanche photodiode 300) that may be coupled to a waveguide. The APD 300 can be a Si/Ge avalanche photodiode. It will be understood that the various layers and components of the APD 300 as illustrated are not necessarily drawn to scale, but rather, they are illustrated in such a manner as to clearly show each of the components.

APD 300 in the illustrated example includes a substrate 310 (FIG. 3). An n-type doped silicon (n$^+$ Si) region 322 can be disposed on at least part of the substrate 310. A multiplication region 324 may be disposed on at least a portion of the n$^+$ Si region 322. In this example, multiplication region 324 is provided as an intrinsic silicon (i-Si) multiplication region 324 disposed on at least a portion of the n$^+$ Si region 322. Intrinsic silicon (i-Si) multiplication region 324 may be unintentionally doped and have a doping concentration based on whatever doping impurities exist as a result of its epitaxial growth. As noted below, in some embodiments, the doping concentration of the multiplication region 324 may be about $1 \times 10^{16}$ cm$^{-3}$ or less.

A charge region 326 may be disposed on at least part of the intrinsic silicon multiplication region 324. In this example, charge region 326 is a p-type doped silicon (p$^-$ Si) region. As noted below, in some embodiments, the doping concentration of p$^-$ Si charge region 326 may be about $2 \times 10^{18}$ cm$^{-3}$. The range of doping concentrations for p$^-$ Si charge region 326 will depend on the doping of the absorption region 328 and intrinsic silicon multiplication region 324 and, in some embodiments is chosen to concentrate the electric field in the thinner p$^-$ Si charge region 326 and intrinsic silicon multiplication region 324, with a lower field in the p$^+$ Ge absorption region 328.

The n$^+$ Si region 322, the intrinsic silicon multiplication region 324, and the p$^-$ Si charge region 326 can form a carrier multiplication region. Multiplication region 324 may provide a fully depleted depletion region of the device. Absorption region 328 may be partially depleted, and photo generated carriers can travel from absorption region 328 to multiplication region 324 through diffusion.

In some embodiments, the thickness of the p$^+$ Ge absorption region 328 is about 400 nm, the thickness of the p$^-$ Si charge region 326 is 50 nm, and the thickness of the intrinsic silicon multiplication region 324 is about 100 nm. In various embodiments, absorption region 328 can range in thickness from about 100 nm to about 1 um. However, the thickness of the absorption region 328 also affects temperature sensitivity, and a thinner absorption region can improve stability. However, if the absorption region is too thin, the responsivity in terms of electrical output per optical input will be low.

Although the p$^-$ Si charge region 326 and the intrinsic silicon multiplication region 324 can have other thicknesses, in some embodiments the combined thickness of these two layers is about 200 nm or less.

In the illustrated example, the doping concentration of the p$^-$ Si charge region 326 is approximately $2 \times 10^{18}$ cm$^{-3}$ although p$^-$ Si region 326 can have other doping concentrations. The doping concentration of the intrinsic silicon multiplication region 324 in the illustrated example is less than about $1 \times 10^{16}$ cm$^{-3}$. In some embodiments, the doping concentration of the intrinsic silicon multiplication region 324 is less than $5 \times 10^{15}$ cm$^{-3}$.

An absorption region 328 may be disposed on at least a portion of the charge region 326. In this example, absorption region 328 is a p$^+$ Ge region and may be epitaxially grown. In some embodiments, p$^+$ Ge absorption region 328 is fully implanted to provide full doping across its entire thickness. Full doping across the entire thickness of p$^+$ Ge absorption region 328 can restrict the device so that the electric field is mostly confined in the p$^-$ Si charge region 326 and multiplication region 324. Confining the electric field to the two Si layers (i.e., p$^-$ Si charge region 326 and intrinsic silicon multiplication region 324) and making these layers extremely thin (e.g., about 150 nm or less in some embodiments) has the effect of making the device extremely temperature insensitive as temperature dependencies are proportional to the thickness of the region. In FIG. 2, the thicknesses of the regions 322, 324, 326, 328 are measured along the vertical dimension between the top and bottom of the page.

The doping concentration of the p$^+$ Ge absorption region 328 in the illustrated example is about $1 \times 10^{18}$ cm$^{-3}$, although p$^+$ Ge absorption region 328 can have other doping concentrations in other embodiments. In various embodiments, doping for the p$^+$ Ge absorption region 328 is not as critical as doping levels, and doping for the p$^+$ Ge absorption region 328 is doped sufficiently to provide good contact with first metal contact 335. For example, the doping concentration of the p$^+$ Ge absorption region 328 may go as high as about $1 \times 10^{20}$ cm$^{-3}$. However, if the doping concentration of the p$^+$ Ge absorption region 328 is too high, the Ge won't be in depletion and won't have sufficient photogenerated carriers. If too low (e.g., below about $1 \times 10^{19}$ cm$^{-3}$, the p$^+$ Ge absorption region 328 won't form a good ohmic contact with first metal contact 335.

Although not illustrated, a passivation region can be disposed on at least a portion of each of the p$^+$ Ge absorption region 328, the p$^-$ Si charge region 326, and the intrinsic silicon multiplication region 324 for surfaces exposed to the environment. One or more first metal contacts 335 can be disposed on the p$^+$ Ge absorption region 328 and one or more second metal contacts 336 can be disposed on the n$^+$ Si multiplication region 324.

The received optical signal, which may be delivered to APD 300 via a waveguide, may be evanescently coupled to the p$^+$ Ge absorption region 328 and cause absorption of the optical energy by this p$^+$ Ge absorption region 328. The absorbed optical energy may excite electrons to a conduction band (i.e., generate free electrons). In an example, the p$^+$ Ge absorption region 328 may have a p-type doping concentration of at least about $5 \times 10^{18}$ atoms/cm$^3$ (e,g,, a p-type doping concentration between about $1 \times 10^{18}$ atoms/cm$^3$ and about $1 \times 10^{20}$ atoms/cm$^3$.

The p$^-$ Si charge region 326 may accelerate the free electrons. The electric field may increase with a relatively steep slope between the region's interface with the p$^+$ Ge absorption region 328 and the interface with the intrinsic silicon multiplication region 324. The drift velocity of the free electrons may increase until reaching a saturation velocity of the p$^-$ Si charge region 326.

The intrinsic silicon multiplication region 324 may amplify the number of free electrons. For example, the intrinsic silicon multiplication region 324 may generate additional free electrons from impact ionization of the accelerated free electrons. The additional free electrons may generate still more electrons through impact ionization of the additional free electrons. Thus, the intrinsic silicon region 216 may multiply the number of free electrons. The intrinsic silicon multiplication region 324 may accelerate some of the free electrons or the additional free electrons to cause the impact ionization. In addition, some impact ionization may occur in the p$^-$ Si charge region 326.

The more highly doped n$^+$ Si region 322 (i.e., a contacting region) may conduct the free electrons generated by absorption and the free electrons generated by impact ionization. For example, the n$^+$ Si region 322 may conduct the electrons to other devices or circuitry, to a metal contact, to an output terminal, or the like. In an example, the n$^+$ Si region 322 may have a doping concentration of at least about $1 \times 10^{20}$ atoms/ cm³. The highly doped n⁺ Si region 322 may have a thickness between about 200 nm and about 2 μm. In one embodiment, the n⁺ Si region 322 may have a thickness of about 220 nm.

Figure 4:
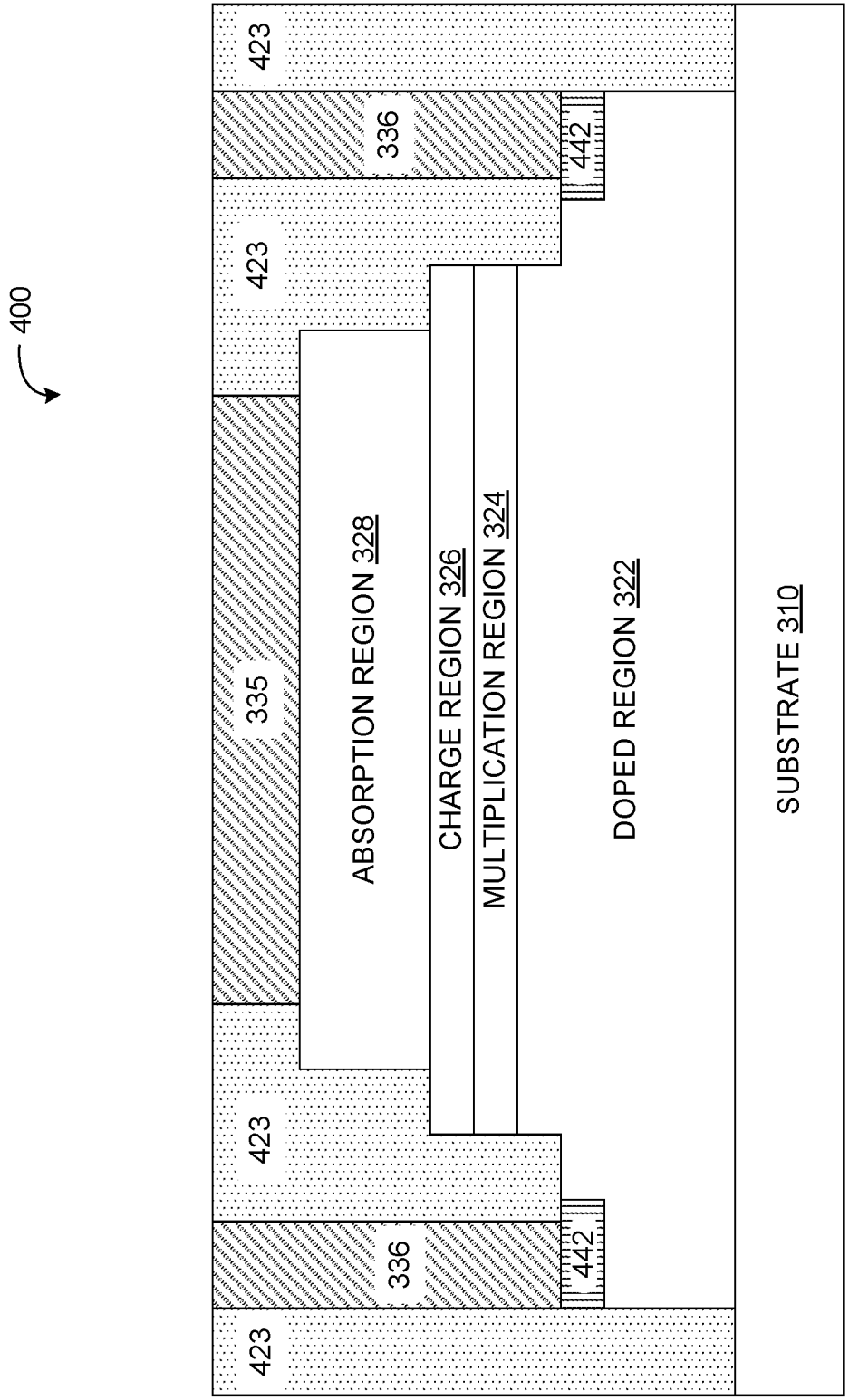
FIG. 4 is a schematic diagram of a cross-section of the example APD of FIG. 3 in accordance with various embodiments.

FIG. 4 is a schematic diagram of a cross-section of the example APD 300 of FIG. 3 in accordance with various embodiments. In this example, APD 400 includes the same structure as APD 300 fabricated on a substrate 310, and also illustrates the inclusion of SiO2 passivation layer 423, and metal contacts 335, 336 extending through passivation layer 423. Although not illustrated, a waveguide (e.g., waveguide 220) may be coupled to the device. For example, in one embodiment a waveguide may be end coupled to doped region 322. As with APD 300, it will be understood that the various layers and components of the APD 400 as illustrated are not necessarily drawn to scale, but rather, they are illustrated in such a manner as to clearly show each of the components. Also illustrated in this example, heavily doped regions 442 may be included where metal contacts 336 are deposited to provide an ohmic contact. Regions 442 can provide a an unimpeded transfer of majority carriers from n+ Si region 322 to metal contacts 336. In one embodiment, the semiconductor material in regions 442 is doped heavily enough that electron tunneling is possible.

Figure 5:
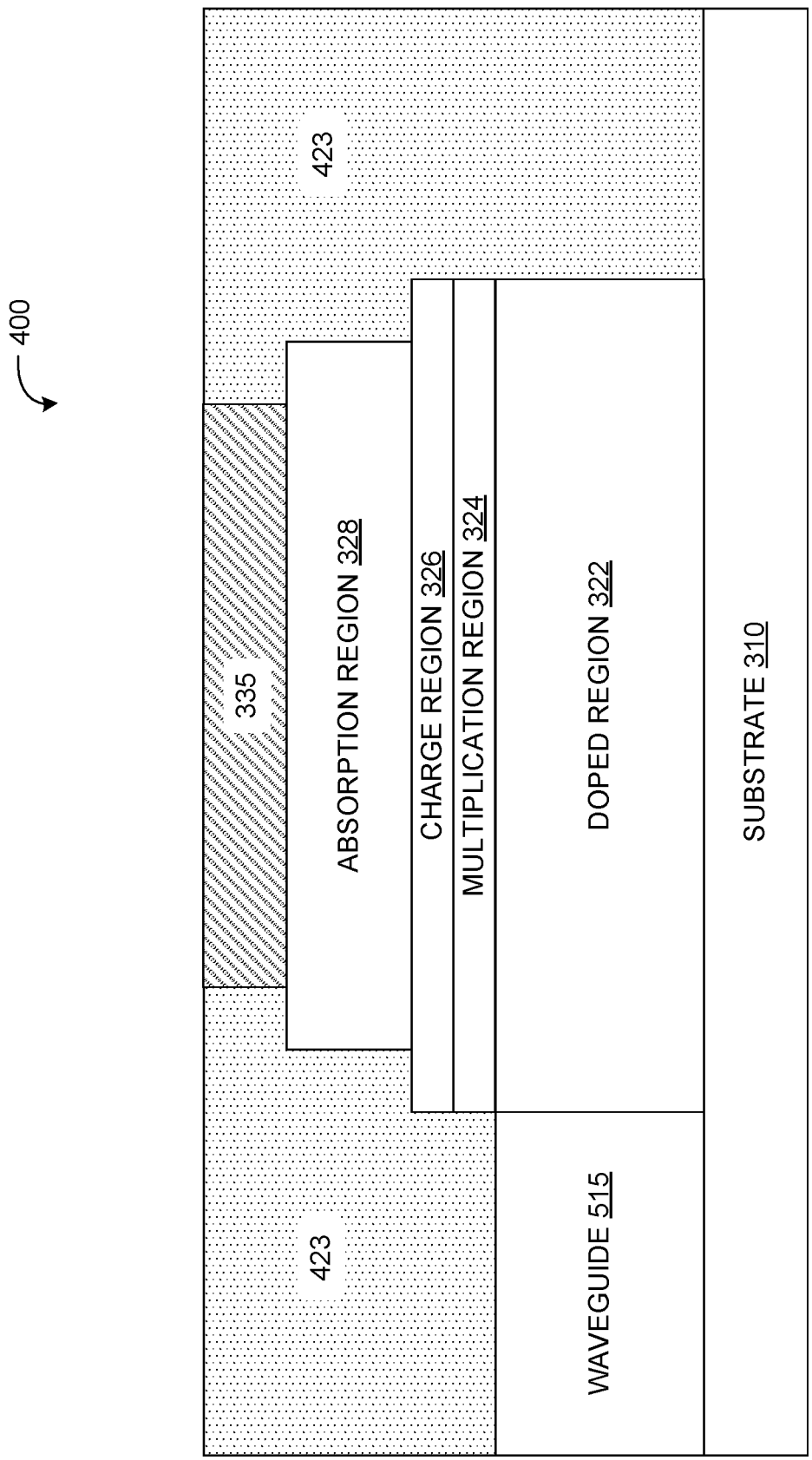
FIG. 5 is a schematic diagram of a cross-section of the APD of FIG. 3, viewed orthogonally to the view in FIG. 4, in accordance with various embodiments.

FIG. 5 is a schematic diagram of a cross-section of the example APD 400 of FIG. 3, viewed orthogonally to the view shown in FIG. 4, in accordance with various embodiments. In this example, the APD 400 includes the same structure as APD 300, but also illustrates a waveguide 515 (e.g., waveguide 220) end coupled to doped region 322. Waveguide 515 may receive an optical signal, such as from a grating coupler (not shown) or from a demultiplexer (e.g., demultiplexer 124), and direct the optical signal from its source to APD 400. Waveguide 515 may include intrinsic silicon in various embodiments. In this example, waveguide 515 is in direct contact with a surface of doped region 322, and may also, in some embodiments, be in contact with multiplication region 324. The optical signal from waveguide 515 evanescently couples to absorption region 328, where the optical energy is absorbed by the absorption region 328. As with APD 300, it will be understood that the various layers and components of APD 400 as illustrated are not necessarily drawn to scale, but rather, they are illustrated in such a manner as to clearly show each of the components.

Figure 6:
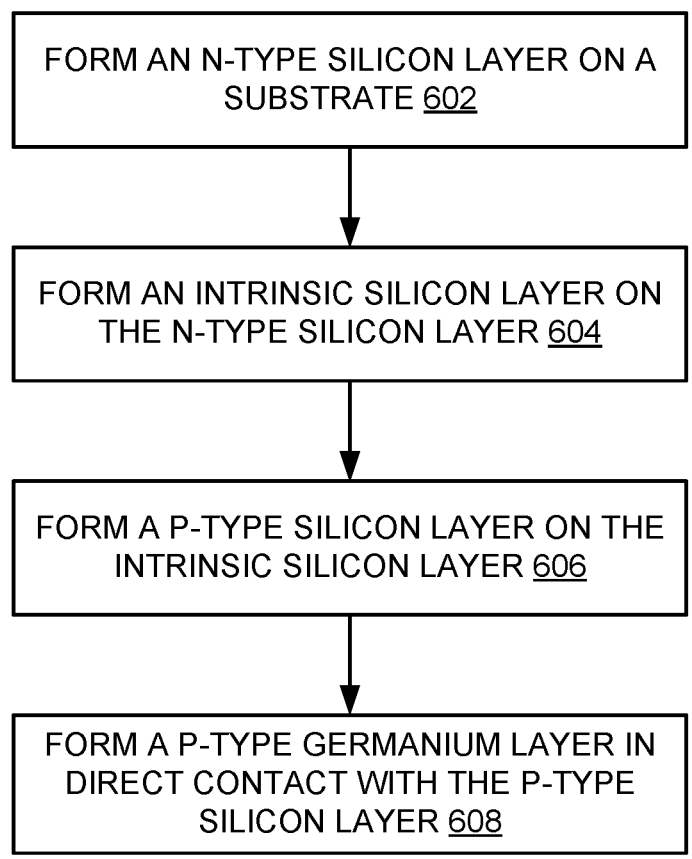
FIG. 6 is a flow diagram illustrating an example method to create a photodiode to detect optical energy.

FIG. 6 is a flow diagram illustrating an example method to create a photodiode to detect optical energy. Referring now to FIG. 6, operation 602 may include forming an n-type silicon layer on a substrate. Then-type silicon layer may be formed by depositing silicon and implanting an n-type dopant (e.g., phosphorus, arsenic, antimony, or the like) in the silicon, by providing a wafer including a layer of silicon and implanting an n- type dopant in the layer of silicon, or the like. As used herein, the term "layer" refers to a region covering or being covered by another region. For example, the n-type silicon layer may be the highly doped n+Si region 322 of the device of FIGS. 3 and 4.

Operation 604 may include forming an intrinsic silicon layer on the n-type silicon layer. For example, in terms of the example devices illustrated in FIGS. 3 and 4, the intrinsic silicon layer may be formed by depositing the intrinsic silicon on the highly doped n⁺ Si region 322 or counter doping p-type doped silicon to form intrinsic silicon. The intrinsic silicon layer may include a small amount of doping (e.g., a small amount of p-type doping or n-type doping). In one example, the intrinsic silicon layer may be the intrinsic silicon multiplication region 324 of the devices illustrated in FIGS. 3 and 4.

Operation 606 may include forming a p-type silicon layer on the intrinsic silicon layer. The p- type silicon layer may be formed by depositing silicon and implanting a p-type dopant (e.g., boron, aluminum, gallium, etc.) in the silicon. In one example, the intrinsic silicon layer and the p-type silicon layer may be formed by a single deposition of silicon followed by implanting the p-type dopant in a top portion of the deposited silicon. In one example, the the p-type silicon layer may be the p⁻ Si charge region 326 of the devices illustrated in FIGS. 3 and 4.

As noted in the examples of FIGS. 3 and 4, the combined thickness of the intrinsic silicon multiplication region 324 and the p⁻ Si charge region 326 is about 160 nm or less. In other embodiments, the combined thickness of the intrinsic silicon multiplication region 324 and the p⁻ Si charge region 326 is about 175 nm or less, is within the range of about 125 nm to about 160 nm, is within the range of about 125 nm to about 160 nm, or other thickness as appropriate to achieve the desired level of temperature insensitivity for the given application.

At operation 608, the method 600 may include forming a p-type germanium layer in direct contact with the p-type silicon layer. In some examples, the p-type germanium layer may be moderately or highly doped. The p-type germanium layer may be formed by depositing germanium and implanting a p-type dopant in the germanium. For example, the p-type germanium layer may be the p⁺ Ge absorption region 328 of the examples of FIGS. 3 and 4.

Example Device.

Figure 7:
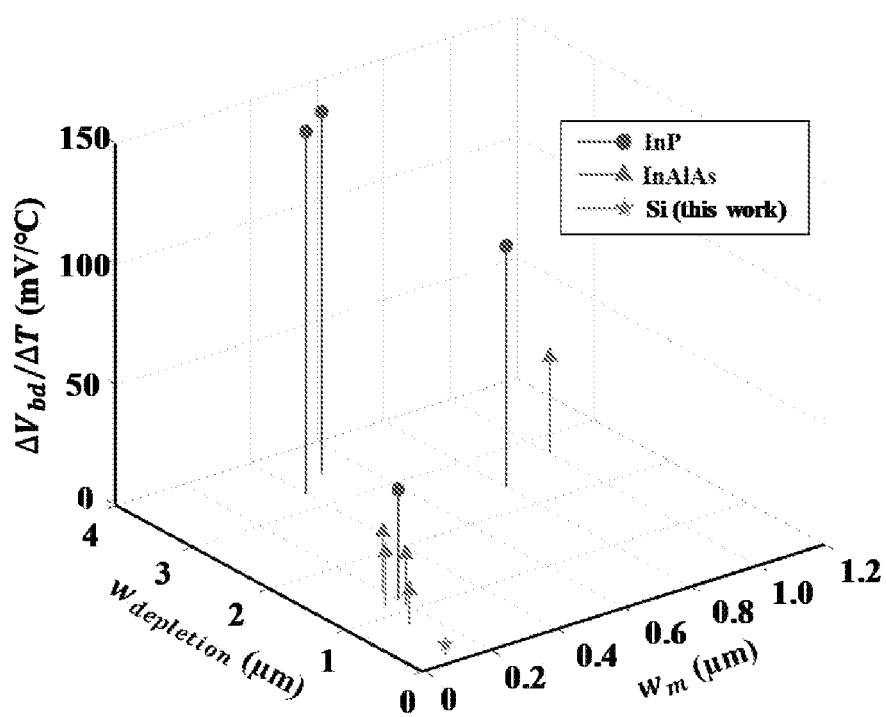
FIG. 7 illustrates a comparison of an embodiment of the present disclosure compared with conventional devices.

As noted, with a fully doped p⁺ Ge absorption region 328, a charge region width of about 50 nm, and a multiplication region with of about 100 nm, the breakdown voltage is extremely stable as compared to prior III-V APD results, and prior SiGe APD results. FIG. 6 illustrates a comparison of an embodiment of the present disclosure compared with conventional devices. The table and accompanying chart in FIG. 7 shows InAlAs-InGaAs devices and InP-InGaAs devices, with breakdown voltage stabilities measured in $\Delta V_{bd}/\Delta T$ ranging from 15-40 mV/º C in the case of InAlAs-InGaAs devices and 46-100 mV/º C in the case of InP-InGaAs devices. This is compared to results of an example embodiment of the present disclosure, which achieved 4.2 mV/º C in modeling analysis.

Other features achieved by such an example embodiment with a fully doped p⁺ Ge absorption region 328 width of about 400 nm, a charge region width of about 50 nm, and a multiplication region with of about 100 nm, include a high multiplication gain of >15, from 23° C. to 90° C.; temperature stability of $\Delta V_{bd}/\Delta T = 4.2$ mV/° C., which may not have been achieved in telecommunication wavelength APDs; a high bandwidth of about 24.6 GHz at 90° C., and only reduced by about 0.09%/° C.; a high gain-bandwidth product of >240 GHz at 90° C., which reduces by about 0.24%/° C.; and an internal quantum efficiency of about 100% when temperatures are greater than 70° C.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A method, comprising:
    forming a highly doped $n^+$ Si region;
    forming an intrinsic silicon multiplication region on at least a portion of the $n^+$ Si region, the intrinsic silicon multiplication having a thickness of about 90-110 nm;
    forming a highly doped $p^-$ Si charge region on at least part of the intrinsic silicon multiplication region, the p Si charge region having a thickness of about 40-60 nm; and
    forming a $p^+$ Ge absorption region on at least a portion of the $p^-$ Si charge region,
    wherein the $p^+$ Ge absorption region is doped across its entire thickness, and
    wherein the $p^+$ Ge absorption region confines an electric field of the photodiode to the intrinsic silicon multiplication region and the $p^-$ Si charge region to achieve a temperature stability of about 4.2 mV/° C.

2. The method of claim 1, wherein a thickness of the $n^+$ Si region is about 100 nm and a thickness of the $p^-$ Si charge region is about 50 nm.

3. The photodiode of claim 1, wherein a doping of the intrinsic silicon multiplication region is less than about $1 \times 10^{16}$ cm$^{-3}$.

4. The photodiode of claim 1, wherein a doping of the $p^-$ Si charge region is about $2 \times 10^{18}$ cm$^{-3}$.

5. The method of claim 1, wherein a doping of the n+ Si region is about $1 \times 10^{20}$ cm$^{-3}$.

6. A photodiode comprising:
    a highly doped $n^+$ Si region;
    an intrinsic silicon multiplication region disposed on at least a portion of the $n^+$ Si region, the intrinsic silicon multiplication having a thickness of about 90-110 nm;
    a highly doped $p^-$ Si charge region disposed on at least part of the intrinsic silicon multiplication region, the $p^-$ Si charge region having a thickness of about 40-60 nm; and
    a $p^+$ Ge absorption region disposed on at least a portion of the $p^-$ Si charge region,
    wherein the $p^+$ Ge absorption region is doped across its entire thickness, and
    wherein the $p^+$ Ge absorption region confines an electric field of the photodiode to the intrinsic silicon multiplication region and the $p^-$ Si charge region to achieve a temperature stability of about 4.2 mV/° C.

7. The photodiode of claim 6, wherein a thickness of the $n^+$ Si region is about 100 nm and a thickness of the $p^-$ Si charge region is about 50 nm.

8. The photodiode of claim 6, wherein a doping of the intrinsic silicon multiplication region is less than about $1 \times 10^{16}$ cm$^{-3}$.

9. The photodiode of claim 6, having an internal quantum efficiency of about 100% at temperatures greater than 70° C.

10. The photodiode of claim 6, wherein a doping of the $p^-$ Si charge region is about $2 \times 10^{18}$ cm$^{-3}$.

11. The photodiode of claim 6, having a gain-bandwidth product of >240 GHz at 90° C.

12. The photodiode of claim 6, wherein a doping of the $n^+$ Si region is about $1 \times 10^{20}$ cm$^{-3}$.

13. The photodiode of claim 6, having a bandwidth of about 24.6 GHz at 90° C.

14. An integrated photonics receiver for an optical communication system, the receiver comprising:
    an optical coupler to couple received light to the receiver;
    a demultiplexer coupled to the optical coupler to demultiplex the received light into a plurality of channels;
    a plurality of photodiodes coupled to the demultiplexer, each photodiode of the plurality of photodiodes comprising:
        a highly doped $n^+$ Si region;
        an intrinsic silicon multiplication region disposed on at least a portion of the $n^+$ Si region, the intrinsic silicon multiplication having a thickness of about 90-110 nm;
        a highly doped $p^+$ Si charge region disposed on at least part of the intrinsic silicon multiplication region, the $p^-$ Si charge region having a thickness of about 40-60 nm; and
        a $p^+$ Ge absorption region disposed on at least a portion of the $p^+$ Si charge region,
        wherein the $p^+$ Ge absorption region is doped across its entire thickness, and
        wherein the $p^+$ Ge absorption region confines an electric field of the photodiode to the intrinsic silicon multiplication region and the $p^-$ Si charge region to achieve a temperature stability of about 4.2 mV/°C.

15. The integrated photonics receiver of claim 14, further comprising a plurality of waveguides coupling the plurality of photodiodes to the demultiplexer, wherein each waveguide of the plurality of waveguides is end coupled to at least part of a surface of the highly doped $n^+$ Si region of its corresponding photodiode.

16. The integrated photonics receiver of claim 14, wherein a thickness of the $n^+$ Si region is about 100 nm and a thickness of the $p^-$ Si charge region is about 50 nm.

* * * * *